US012573848B2

(12) United States Patent
Cheng et al.

(10) Patent No.: US 12,573,848 B2
(45) Date of Patent: Mar. 10, 2026

(54) AUTOMATED HIGH-SPEED POWER SYSTEM EVENT DETECTION AND CLASSIFICATION USING SYNCHROPHASOR DATA

(71) Applicant: Quanta Technology, LLC, Raleigh, NC (US)

(72) Inventors: Zheyuan Cheng, Apex, NC (US); James Jeffery Schmidt, Raleigh, NC (US); Yi Hu, Raleigh, NC (US); David Hart, Raleigh, NC (US); Juergen Holbach, Raleigh, NC (US)

(73) Assignee: Quanta Technology, LLC, Raleigh, NC (US)

( * ) Notice: Subject to any disclaimer, the term of this patent is extended or adjusted under 35 U.S.C. 154(b) by 398 days.

(21) Appl. No.: 18/131,155

(22) Filed: Apr. 5, 2023

(65) Prior Publication Data

US 2024/0338065 A1    Oct. 10, 2024

(51) Int. Cl.
*H02J 3/24* (2006.01)
*G01R 31/12* (2020.01)
*G06F 1/3206* (2019.01)

(52) U.S. Cl.
CPC .............. *H02J 3/242* (2020.01); *G01R 31/12* (2013.01); *G06F 1/3206* (2013.01); *H02J 3/241* (2020.01)

(58) Field of Classification Search
None
See application file for complete search history.

(56) References Cited

U.S. PATENT DOCUMENTS 11,042,132 B2 *  6/2021  Fan ...................... G05B 13/042
11,170,304 B1 *  11/2021  Bi ........................... G06N 20/00
11,232,361 B1 *  1/2022  Bi ..................... G06F 18/21322
11,604,502 B2 *  3/2023  Menzel ................... G06F 1/28
(Continued)

FOREIGN PATENT DOCUMENTS

CN        118655413 A  *  9/2024  ............. G01R 31/08
CN        118657045 A  *  9/2024  ............. G06F 30/23
(Continued)

*Primary Examiner* — Kevin R Steckbauer
(74) *Attorney, Agent, or Firm* — Murphy, Bilak & Homiller, PLLC

(57)        ABSTRACT

Methods for detecting power system events in an electrical power system. An example method comprises determining a signal envelope for each of at least first and second power system signals and performing density-based spatial clustering of a series of points formed by combining respective values of the signal envelopes for at least the first and second power system signals. The example method further comprises detecting one or more power system events by identifying outlier points or groups of points in the spatial clustering. Some methods may further comprise automatically classifying power system events by collecting a data set comprising, for each detected power system event, power system signal features corresponding to the detected power system event, and classifying each of the detected power system events using the data set and a machine-learning-based classification algorithm, where said classifying comprises determining a classification label from among two or more predetermined classification labels.

14 Claims, 5 Drawing Sheets

(56)     References Cited

U.S. PATENT DOCUMENTS

| | | | | |
|---|---|---|---|---|
| 11,668,764 B2* | 6/2023 | Menzel | .................. | G05B 19/00 |
| | | | | 702/58 |
| 12,094,319 B2* | 9/2024 | Menzel | ............. | H02J 13/00002 |
| 2020/0387121 A1* | 12/2020 | Fan | ....................... | G05B 13/042 |
| 2021/0103006 A1* | 4/2021 | Menzel | ................. | H02J 3/0012 |
| 2021/0165476 A1* | 6/2021 | Menzel | .................... | G06F 1/28 |
| 2022/0091289 A1* | 3/2022 | Tinker | .................... | G01V 1/18 |
| 2023/0394950 A1* | 12/2023 | Menzel | ............... | G06Q 10/063 |
| 2024/0338065 A1* | 10/2024 | Cheng | ................... | G06F 1/3206 |

FOREIGN PATENT DOCUMENTS

| | | | | | | |
|---|---|---|---|---|---|---|
| CN | 118965240 A | * | 11/2024 | ......... | G06F 18/2431 |
| CN | 119577556 A | * | 3/2025 | ............. | G06Q 50/06 |
| CN | 119577556 B | * | 4/2025 | ............. | G06Q 50/06 |
| CN | 118657045 B | * | 5/2025 | ............. | G06F 30/23 |
| CN | 118965240 B | * | 5/2025 | ......... | G06F 18/2431 |
| CN | 120123701 A | * | 6/2025 | ............. | G06Q 50/26 |
| WO | WO-2019195582 A1 | * | 10/2019 | ............. | H02J 3/0012 |

* cited by examiner

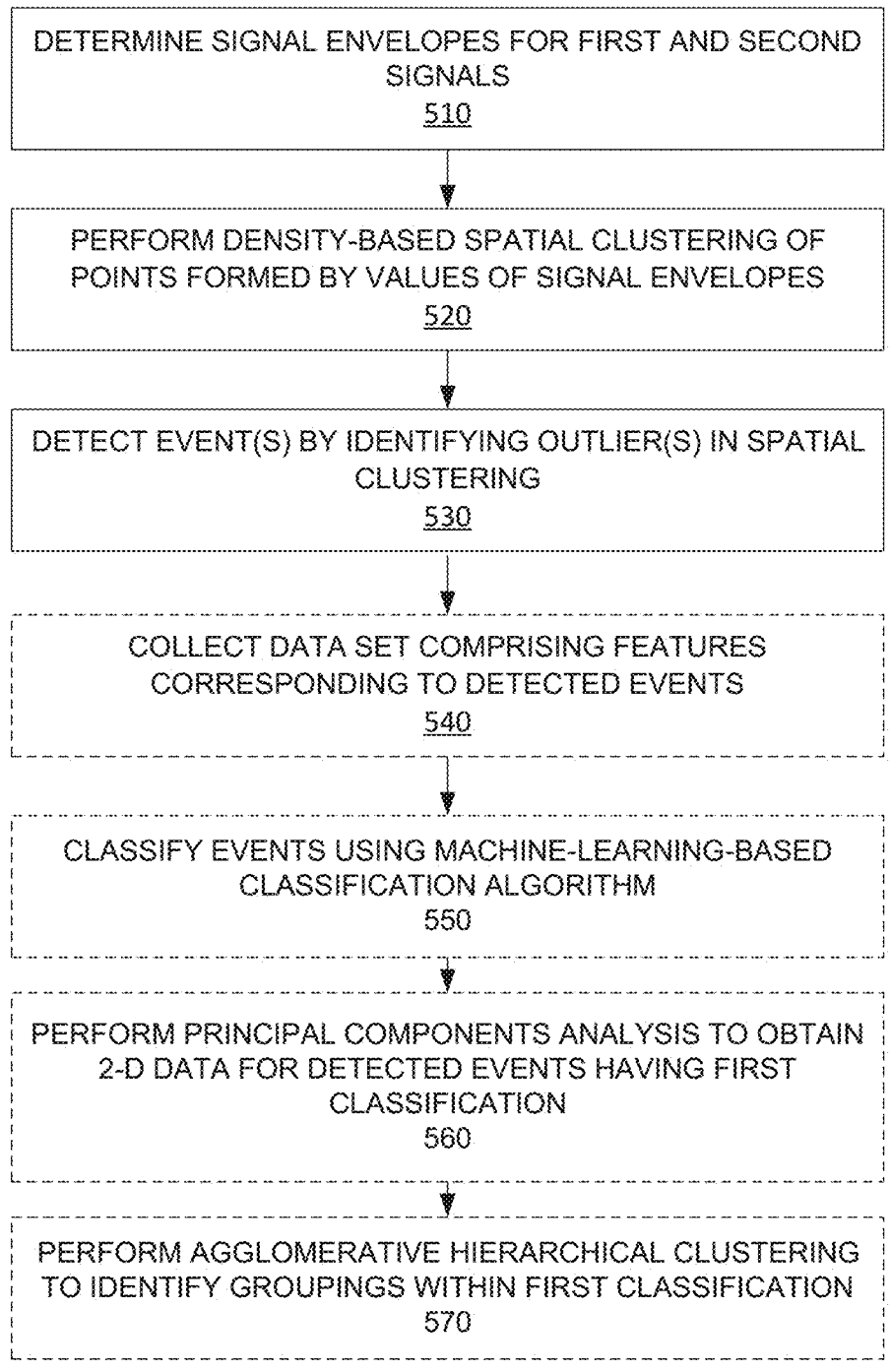

DETERMINE SIGNAL ENVELOPES FOR FIRST AND SECOND
SIGNALS
510

PERFORM DENSITY-BASED SPATIAL CLUSTERING OF
POINTS FORMED BY VALUES OF SIGNAL ENVELOPES
520

DETECT EVENT(S) BY IDENTIFYING OUTLIER(S) IN SPATIAL
CLUSTERING
530

COLLECT DATA SET COMPRISING FEATURES
CORRESPONDING TO DETECTED EVENTS
540

CLASSIFY EVENTS USING MACHINE-LEARNING-BASED
CLASSIFICATION ALGORITHM
550

PERFORM PRINCIPAL COMPONENTS ANALYSIS TO OBTAIN
2-D DATA FOR DETECTED EVENTS HAVING FIRST
CLASSIFICATION
560

PERFORM AGGLOMERATIVE HIERARCHICAL CLUSTERING
TO IDENTIFY GROUPINGS WITHIN FIRST CLASSIFICATION
570

*FIGURE 5*

AUTOMATED HIGH-SPEED POWER SYSTEM EVENT DETECTION AND CLASSIFICATION USING SYNCHROPHASOR DATA

TECHNICAL FIELD

The present disclosure relates generally to electrical power systems, and more particularly relates to event detection and classification in such systems.

BACKGROUND

Modern electrical power systems are equipped with many measurement devices, such as phasor measurement units (PMUs), to monitor various signal parameters throughout the grid. The measurements returned from these devices, referred to as synchrophasor, represent measurements of current and/or voltage magnitudes, phase angles, and frequency, and can be analyzed to detect abnormal operation including "faults," which may result from any of a wide variety of equipment failures, line failures or damage, etc., and other events such as frequency drops and oscillation events.

The basic principle of abnormal event detection in such networks is to detect abnormal changes, e.g., sudden drops/ jumps, in the power system signals, as reflected in the measurements discussed above. The underlying assumption is that in normal operation the power system signals, e.g., voltage, current, frequency, etc., stay relatively steady with respect to abnormal operating conditions. Unusual changes in these signals may indicate a fault or unstable conditions. These abnormal events, however, may be of various types and severities. Some may self-correct, while others require action by system operators.

Given the size and complexity of the electrical power systems, the quantity of measurement data available for analysis can be extremely large. For example, a sample 35-PMU data set evaluated by the present inventors, as discussed below, comprises 6.8 terabytes of data, spanning two years of system operation. The sheer quantities of data needed to monitor an entire electrical system's operation over time presents serious challenges for automatic detection and classification processes. In particular, the massive quantities of data necessitate a quick and efficient mechanism for event detection. Once events are reliably detected, data corresponding to the event can be evaluated further, for classification and further characterization.

SUMMARY

The techniques described herein address these problems by providing an efficient and reliable process for event detection, using spatial clustering of data points formed by pairing signal envelope data, from signal envelopes obtained from power system signal measurements. After events are detected, corresponding feature data can be evaluated, e.g., using machine-learning algorithms, to quickly and accurately classify the events. The data can be further analyzed, e.g., using event data corresponding to each classification category, to identify sub-categories of events within each classification category.

An example method for detecting power system events in an electrical power system, according to some embodiments disclosed herein, thus comprises the steps of determining a signal envelope for each of at least first and second power system signals and performing density-based spatial clustering of a series of points formed by combining respective values of the signal envelopes for at least the first and second power system signals. This example method further comprises detecting one or more power system events by identifying outlier points or groups of points in the spatial clustering. These first and second power system signals might be any one of the following pairs, in various embodiments or instances of the method: positive sequence voltage magnitude and frequency; positive sequence voltage magnitude and positive sequence current magnitude; positive sequence voltage magnitude and rate of change of frequency (ROCOF); positive sequence current magnitude and frequency; and positive sequence current magnitude and ROCOF.

In some embodiments or instances of a method like that summarized above, the method may further comprise automatically classifying the one or more power system events, by collecting a data set based on the detected power system events, the data set comprising, for each of the detected power system events, a plurality of power system signal features corresponding to the detected power system event, and classifying each of the detected power system events using the data set and a random forest classifier algorithm. This classifying comprises determining a classification label from among two or more predetermined classification labels.

Variations of these methods and corresponding apparatuses are described in the detailed description below, which is best understood in conjunction with the attached figures.

BRIEF DESCRIPTION OF THE FIGURES

FIG. 5 is a process flow diagram illustrating an example method, according to some embodiments.

DETAILED DESCRIPTION

As noted above, event detection from large volumes of synchrophasor data is a critical first step before deeper analysis of a power system's abnormal operation can be performed. Accordingly, it is critical that this event detection be performed quickly and efficiently, from a data processing standpoint, and reliable.

The techniques described herein perform this detection using signal envelope data, where a signal envelope represents the maximum and minimum excursions of a signal parameter, such as voltage magnitude, current magnitude, frequency, over a moving "window" of time. The envelope for a given signal parameter can be obtained via moving minimum and moving maximum functions, where these functions use a particular window size. Other techniques might be used to obtain these envelopes, with the idea being simply that the resulting envelopes are representative of the minimum and maximum excursions of the signal parameter over time, based on a moving window in which those minimum and maximum excursions are captured.

This use of signal envelope data is motivated by the discovery, after extensive visual inspection of field-recorded synchrophasor data, that the area between the upper and lower bounds of the signal envelope for various power system signals is larger than the areas during normal operation. For this reason, this signal envelope area is chosen as a key feature to detect abnormal events.

Figures 1, 2:
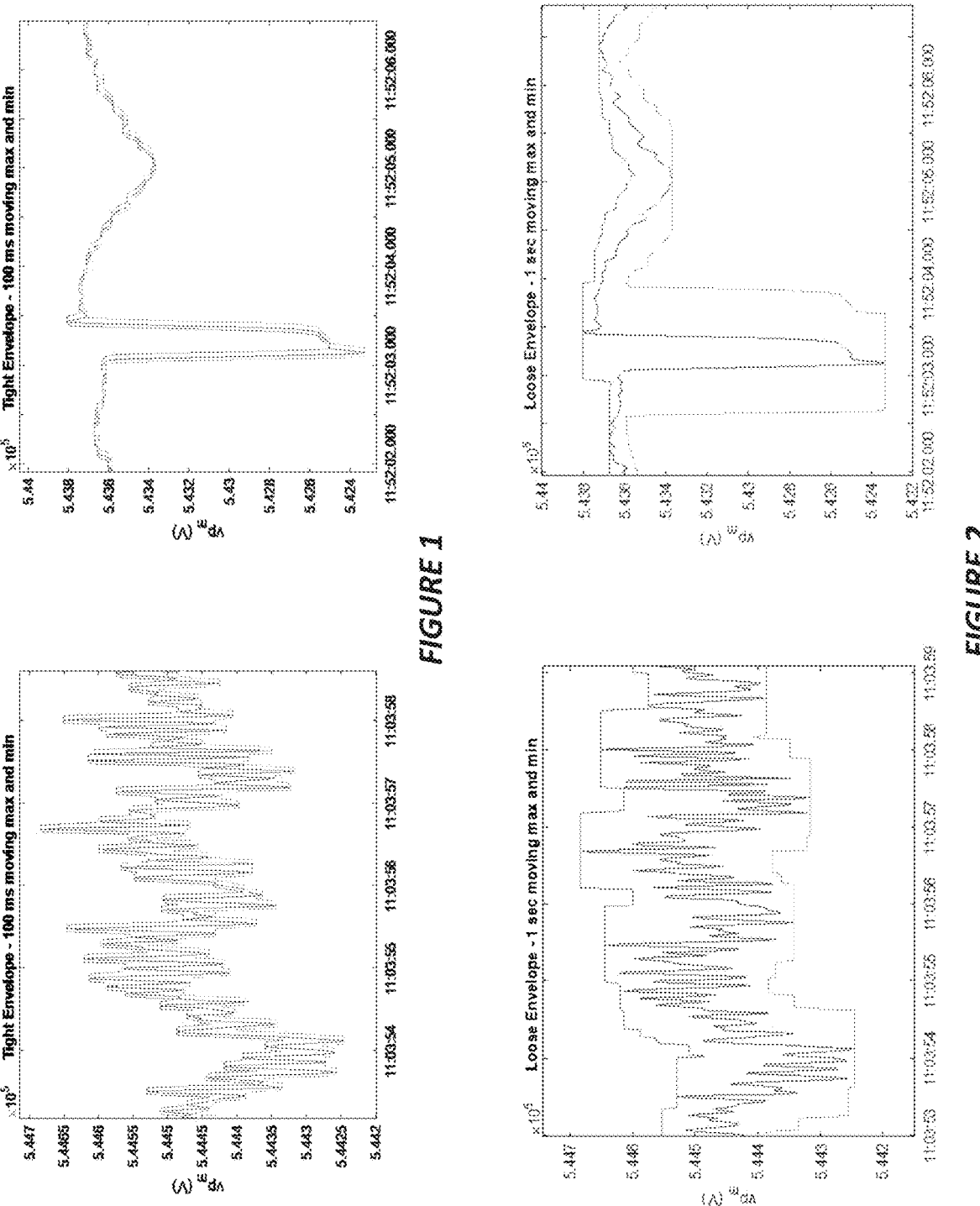
FIG. 1 shows synchrophasor data for two power system event examples, with tightly calculated signal envelopes.
FIG. 2 shows synchrophasor data for the same two power system event examples, as FIG. 1, with loosely calculated signal envelopes.

However, the size of the windows used to create these envelopes is important to the successful detection of abnormal events. This can be seen in FIG. 1 and FIG. 2, which each illustrate two sets of power system event examples, using field-recorded synchrophasor data corresponding to an oscillation event and a line event. These examples use positive sequence voltage data. For a tightly calculated signal envelope, e.g., using 100-ms moving minimum and maximum functions, the signal envelope area remains relatively small during the voltage oscillation event and line event shown on the left and right sides of FIG. 1, respectively, because the envelope signal closely follows the recorded data. Hence, it is difficult to accurately identify events using these signal envelopes. But, when the same data is used to calculate a looser signal envelope, i.e., an envelope calculated using a larger window for the minimum/maximum functions, as shown in FIG. 2, the signal envelope areas during the events are substantially larger than the areas for the same signal envelope during normal operation. This allows one to distinguish between an abnormal event, which may be referred to herein as simply an "event," and normal operation of the power system.

In the syncrophasor data typically available from measurement units in the power system, there are many signals that are available for event detection. Extensive testing has shown that the following signals may provide the best detection performance for a wide variety of events:

Positive sequence voltage magnitude

Positive sequence current magnitude

Frequency

Rate-Of-Change-Of-Frequency (ROCOF)

Experiments with different envelope sizes, e.g., 100 ms, 500 ms, 1 sec, 5 sec, 10 sec, 1 min, etc., coupled with practical experience, suggest that it is best, for event detection purposes, to select a signal envelope size that is one order of magnitude larger than the typical event duration for the events of interest. As the line event example shown on the right-hand side of FIG. 2 illustrates, for detecting a sub-second line event an envelope size of 1 sec is good enough to distinguish between an event and normal operation.

The illustrated examples in FIG. 2 show that the area of the signal envelope per unit time can be used as an indicator of abnormal versus normal power system behavior. The challenge is to perform automatic detection of abnormal events, in a quick and reliable manner. This can be done by performing spatial clustering analysis, using points formed from two (or more) power system signal envelopes.

One approach to this spatial clustering analysis is to apply the density-based spatial clustering of applications with noise (DBSCAN) algorithm, which is a well-known machine-learning-based algorithm, to distinguish between events and normal operations. DBSCAN is a data clustering algorithm proposed in 1996. It is a density-based, clustering, non-parametric algorithm. Given a set of points in some space, the DBSCAN algorithm groups together points that are closely packed together (points with many nearby neighbors) and marking points that lie alone in low-density regions (whose nearest neighbors are too far away) as outliers. DBSCAN is one of the most common clustering algorithms and is also one of the most cited clustering algorithms in scientific literature.

Since power system events are rare during normal operation, the clustering results of the DBSCAN will be clusters of normal operations, whereas remarkable events are outliers that don't fit into any clusters. Thus, identifying the outliers that are isolated by the DBSCAN algorithm amounts to detecting abnormal power system events.

Since DBSCAN is a spatial clustering algorithm that works on two-dimensional space, it is necessary to introduce a second dimension to facilitate event detection. Examples of signal envelope pairs that might be used include:

Positive sequence voltage magnitude and frequency

Positive sequence voltage magnitude and positive sequence current magnitude

Positive sequence voltage magnitude and ROCOF

Positive sequence current magnitude and frequency

Positive sequence current magnitude and ROCOF

Figure 3:
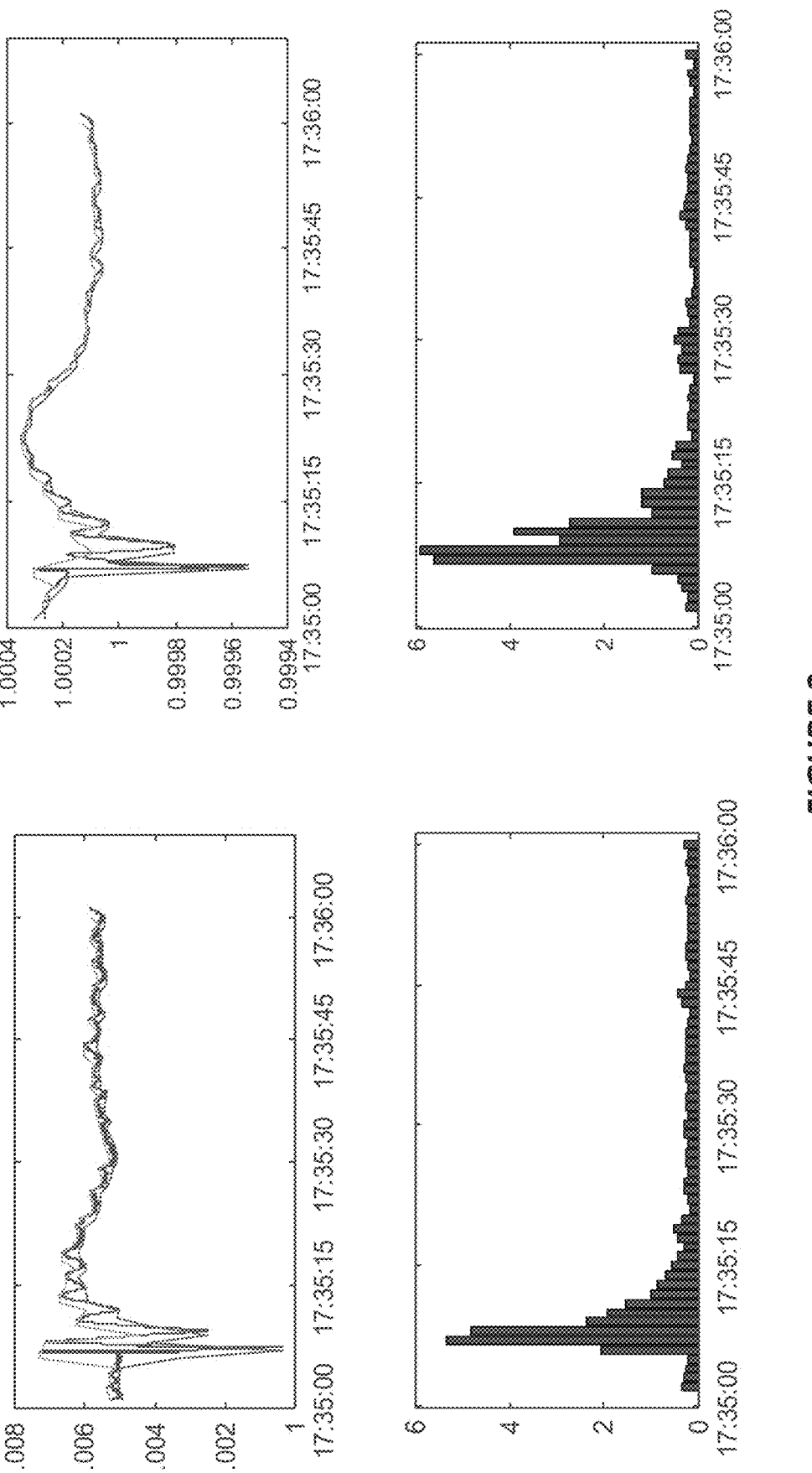
FIG. 3 illustrates example positive sequence voltage magnitude data and frequency data for an example event.
Figure 4:
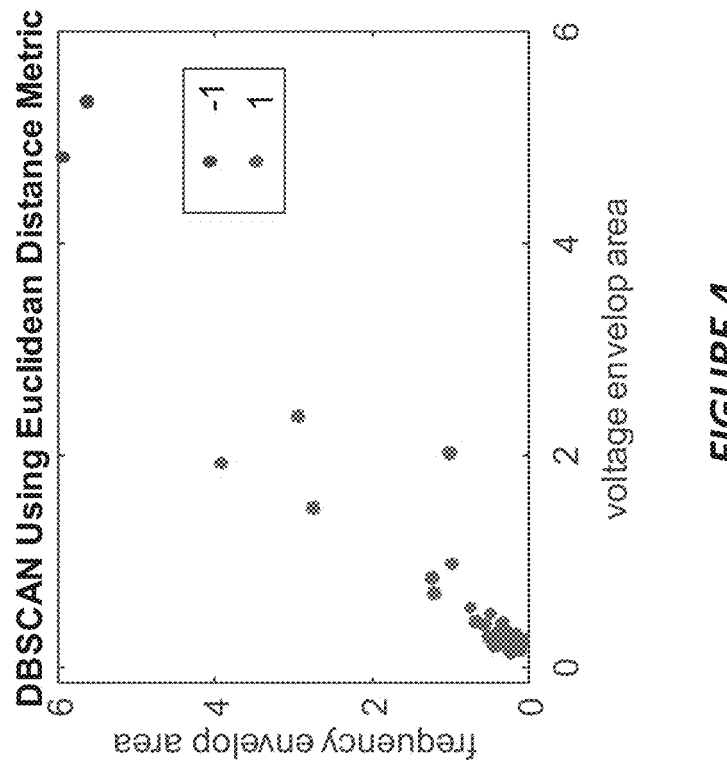
FIG. 4 shows clustering results for the example data from FIG. 3.

FIG. 3 and FIG. 4 illustrate an example of an event detected by the proposed DBSCAN algorithm. FIG. 3 shows the positive sequence voltage magnitude data and frequency data for a time interval including the event, at the top-left and top-right of the figure. Normalized envelope areas corresponding to each of these plots are shown below, at the bottom-left and bottom-right of the figure. This disturbance occurred at around 17:35:05 and lasted for 20 seconds. One can observe oscillations in both positive sequence voltage and frequency signals during the event. Furthermore, it can be observed that the envelope areas during the event are significantly larger than those envelope areas in normal conditions. FIG. 4 presents the spatial clustering results of DBCAN, using the paired values of the envelope areas for the positive sequence voltage magnitude and frequency. As can be seen, there are two clear outliers, corresponding to the event, indicating that the algorithm picked up this event accurately.

Note that FIG. 3 and FIG. 4 illustrate detection of an event using a single pairing of signal envelope area data. DBSCAN clustering can be performed on multiple pairs, e.g., the five pairs suggested above.

The detection results from the multiple clustering results can be consolidated and filtered before a final list of events is generated. In experimentation, visual inspections have been performed on events detected from 6.8 TB of field recorded synchrophasor data. All the detected events were visually confirmed to be valid events.

High-speed event detection is important when dealing with massive amount of synchrophasor data. The techniques described herein lend themselves well to a parallel computing architecture that allows the host computer to take advantage of all available CPU cores for better time efficiency. The scalability of the algorithms described here has been tested on a 64-core workstation with 6.8 TB of field recorded synchrophasor data spanning over 2 years. In these tests, it took only 7.8 hours for the detection algorithm described here to scan through this 2-year synchrophasor dataset (6.8 TB) and create a list of events.

Once events have been identified using the techniques described above, further automatic processing can be applied to automatically classify those events, using synchrophasor data corresponding to the detected events. This automatic processing can use machine-learning-based automated classification.

For instance, some or all of the following feature data shown in Table 1 might be extracted from the synchrophasor data, for time intervals corresponding to the detected events. Note that "ROCOF" refers to rate-of-change-of-frequency. Several of the features below involve averages—these are averages calculated over a certain predetermined time interval, computed at intervals using the synchrophasor data. A similar approach is taken for the "maximum" parameters—these may be computed at intervals using a sliding window.

TABLE 1

| Variable Name | Description |
| --- | --- |
| Area_V_Avg | Average Voltage Envelope Area |
| Area_V_Max | Maximum Voltage Envelope Area |
| Area_F_Max | Maximum Frequency Envelope Area |
| Area_R_Avg | Average ROCOF Envelope Area |
| Area_R_Max | Maximum ROCOF Envelope Area |
| F_Slope | Frequency Slope Value |
| F_Drop | Frequency Drop Value |
| OscFrq | Oscillation Frequency |
| OscAmp | Oscillation Amplitude |
| OscDmp | Oscillation Damping Ratio |
| dV | Derivative of Voltage |
| dVV | Second Derivative of Voltage |
| PMU | Number of PMUs that Detected Event |
| Duration (Seconds) | Duration of Event |

A machine-learning classification algorithm can be used to "train" a model, using event detection-related data corresponding to the events detected using the spatial-clustering techniques described above. A data set containing PMU measurements corresponding to detected events is collected, with this data being separated into features (x variables) and target (y variable) columns for the classification labels. Event duration time stamps may be converted into an integer value that represents seconds. New features representing interaction effects may be created, by combining features, e.g., with multiplication, summing, and the like.

Once the data set is assembled, it can be split into test and training sets. For instance, 80% of an available data set can individual label accuracy are computed. Final label prediction and label prediction label probabilities are outputted. Column labels are assigned, and the original dataset is then combined with prediction labels and prediction label probabilities. Once combined, the new dataset can be output as a csv file.

Depending on the application, the analysis must strike a balance between overfitting and overall accuracy. The training model takes this into account to best categorize future data while also reducing bias. Using experimental data, an overall model accuracy of 86% has been observed, using four event classifications of "frequency drop," "moderate fault," "severe fault," and "others," with frequency drop classification accuracy at 93%, moderate fault at 80%, severe fault at 87%, and others at 87%.

If the training data set changes, a hyper parameter tuning module can be applied to the new model to cycle through, e.g., 53,360 combinations of parameters and return parameters that optimize model accuracy.

The analysis can be carried further by identifying subclassifications of the initial classifications. To do this, the full dataset is queried by label and separated into smaller datasets, i.e., one for each classification. For the example discussed here, this is four smaller datasets. For each of these data sets, principal components analysis (PCA) can be utilized to reduce the dimensionality of the data to two dimensions. Agglomerative hierarchical clustering can then be applied to each of the smaller datasets to locate groupings within each categorization.

Using experimental data, this approach has been tested, with the results being the identification of multiple subclusters within each of the broader classifications. These are shown in Table 2, with the descriptions of the identified subclusters under each classification referring back to the feature values in Table 1.

TABLE 2

| SEVERE FAULT | MODERATE FAULT | FREQUENCY DROP | OTHERS |
| --- | --- | --- | --- |
| Cluster 1: Main cluster | Cluster 1: Main cluster | Cluster 1: Main cluster | Cluster 1: Main cluster |
| Cluster 2: High dV and DVV with short Duration and low PMU | Cluster 2: Highest oscillation amplitude (single point outlier) | Cluster 2: Combination of higher oscillation frequency and higher oscillation amplitude | Cluster 2: Higher oscillation amplitude |
| Cluster 3: High dV, dVV, and highest Area_V_ Max with short Duration and low PMU | | Cluster 3: High dV, dVV, Area_V_Max, and Area_V_Avg | |
| Cluster 4: High dVV and Area_V_Max with short Duration and low PMU | | Cluster 4: High dV, dVV, Area_V_Max, Area_V_Avg, and Oscillation Frequency | |
| Cluster 5: Highest dV and dVV with short Duration | | Cluster 5: Middle/High dV, Middle/High dVV, and Middle/High Area_V_Max | | be allocated to the training set and 20% to the test set. The training set is labeled with classifications, based on off-line analysis. Once split, the data can be run through a Random Forest Classifier module, e.g., from the sklearn library in Python. An example model might use the following parameters: criterion="entropy", n_estimators=20, min_samples_split=5, min_samples_leaf=1, max_features='auto', max_depth=20, bootstrap=False, and random_state=i (i is specified earlier in the script to determine random state). This model utilizes a random state of 12. Overall and Labels corresponding to some or all of these identified subclusters can be added to test data, which can then be used for further training of the machine-learning model, to facilitate further refinement in the subsequent classification of events.

In view of the detailed examples given above, regarding techniques for automatically detecting and classifying power system events in an electrical power system, it will be appreciated that FIG. 5 is a process flow diagram illustrating a generalized method, for detecting power system events.

This generalized method is intended to encompass those techniques described above-thus, where the terminology used below differs from that above, terms used below should be understood to at least encompass the related or similar terms used above.

As shown at block 510, the illustrated method comprises the step of determining a signal envelope for each of at least first and second power system signals. The method further comprises performing density-based spatial clustering of a series of points formed by combining respective values of the signal envelopes for at least the first and second power system signals, as shown at block 520. The method still further comprises detecting one or more power system events by identifying outlier points or groups of points in the spatial clustering.

In some embodiments or instances of the illustrated method, the first and second power system signals are one of the following pairs of power signals: positive sequence voltage magnitude and frequency; positive sequence voltage magnitude and positive sequence current magnitude; positive sequence voltage magnitude and rate of change of frequency (ROCOF); positive sequence current magnitude and frequency; and positive sequence current magnitude and ROCOF. Of course, these are not the only possible examples. Further, various implementations may use multiple pairs, from this list or not.

In some embodiments or instances, the method shown in FIG. 3 may further comprise automatic classification operations. In some embodiments or instances, automatic classification may be done by collecting a data set based on the detected power system events, the data set comprising, for each of the detected power system events, a plurality of power system signal features corresponding to the detected power system event, and classifying each of the detected power system events using the data set and a machine-learning-based classification algorithm, such as a random forest classifier algorithm, where this classifying comprises determining a classification label from among two or more predetermined classification labels. These operations are shown at blocks 540 and 550 in FIG. 5, which are illustrated with dashed outlines to indicate that these steps need not appear in every instance or embodiment of the illustrated method. The plurality of power system signal features referred to here may include one or more features selected from the following, in various embodiments: average voltage envelope area; maximum voltage envelope area; maximum frequency envelope area; average rate-of-change-of-frequency (ROCOF) envelope area; maximum ROCOF envelope area; frequency slope value; frequency drop value; oscillation frequency; oscillation amplitude; oscillation damping ratio; derivative of voltage; second derivative of voltage; number of phasor measurement units (PMUs) that detected the power system event; and duration of event.

In some of these embodiments or instances where automatic classification is performed, the two or more predetermined classification labels include at least one label selected from the following: severe fault; moderate fault; frequency drop; and other. In some embodiments or instances, the method may still further comprise using power system signal features corresponding to detected power system events having a first classification, performing principal components analysis (PCA) to reduce the dimensionality of the features, to obtain two-dimensional data corresponding to the detected power system events having the first classification, as shown at block 560 of FIG. 5, followed by performing agglomerative hierarchical clustering of the two-dimensional data, as shown at block 570, to identify two or more groupings of events within the detected power system events having the first classification. This may be repeated for each of one or more additional classifications, in some embodiments or instances.

Figure 6:
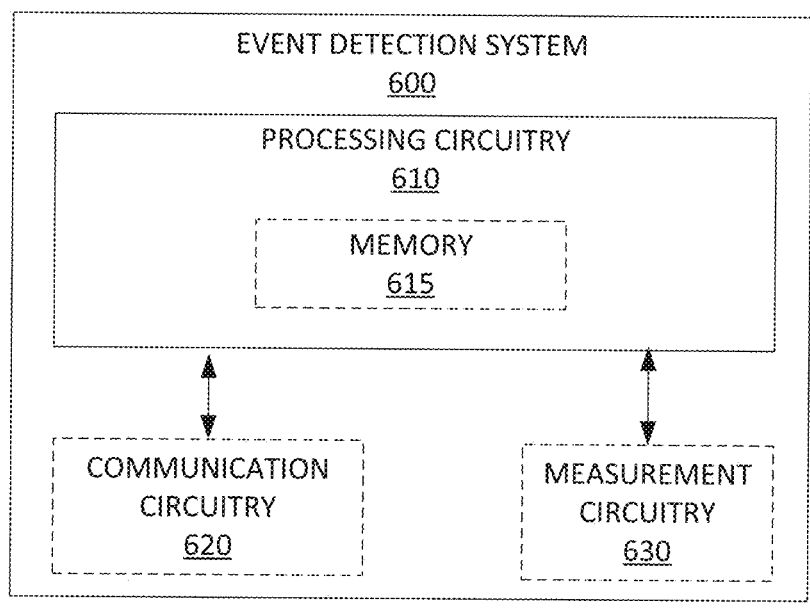
FIG. 6 is a block diagram of an example event detection system, according to some embodiments.

FIG. 6 shows a block diagram illustrating an example event detection system 600 as implemented according to some embodiments. As shown, the event detection system 600 includes processing circuitry 610. The processing 610 may be configured, e.g., with appropriate program code stored in memory 615, to carry out any or all of the detection and/or classification techniques described herein. The processing circuitry 610 in some embodiments, for example, executes instructions stored in memory 615 such that the event detection system 600 carries out a method according to the example methods illustrated in FIG. 5 and described above.

In some embodiments, the event detection system 600 may be regarded as including measurement circuitry 630, which might comprise, for example, PMUs deployed in the electrical power system in which event detection system 600 resides or two which it is attached. The measurement circuitry 630 may, for instance, measure at least some of the currents or voltages at various points in the electoral power system and provide measurements to the processing circuitry 610.

In other embodiments, the event detection system 600 alternatively or additionally includes communication circuitry 620. The communication circuitry 620 may, for instance, receive measurements obtained from measurement devices, such as PMUs, deployed at various points in an electrical power system. In this case, the communication circuitry 620 may provide the measurements to the processing circuitry 610, in order for the processing circuitry 610 to carry out one or more of the techniques described herein.

Figure 7:
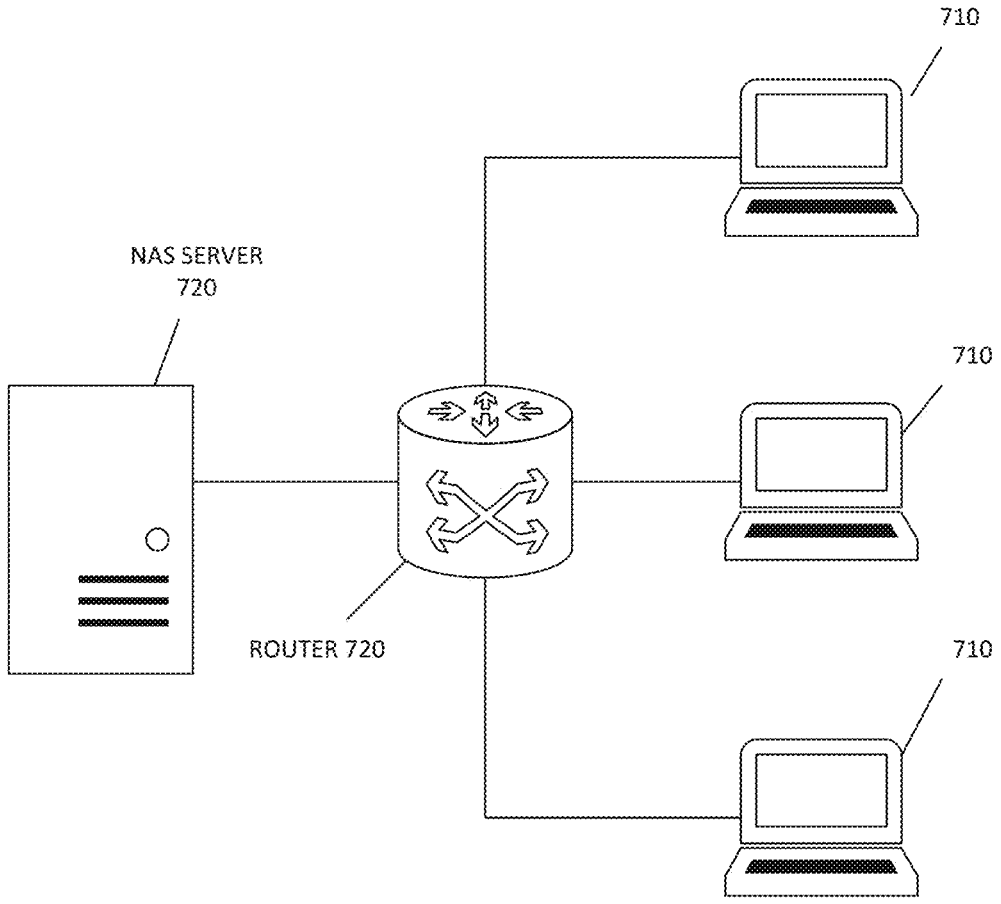
FIG. 7 illustrates another example event detection system, according to some embodiments.

In various embodiments, the algorithms and methods described herein may be implemented on a single multi-core workstation/controller or in a cluster of workstations 710 connected to one another and to a server 720 via a router 730, as shown in FIG. 7. This approach allows the algorithms to take advantage of the parallel processing capability of the multi-core CPU or several workstations with multi-core CPUs. For example, a 2-year PMU data set might be segmented into 64 pieces for a 64-core workstation to run 64 instances of event detection simultaneously, therefore speeding up the detection speed by 64 times. This segmentation routine may be embedded in the detection algorithm, e.g., in such a way the segmentation is done automatically based on available hardware computing resources. PMU data might be stored at a centralized database such as at the NAS (network-attached storage) server 720 shown in FIG. 7, e.g., when working with historical PMU data, such that the data can be retrieved by workstations via appropriate communication protocols via an Ethernet network.

Generally, then, event detection system 600 may perform the methods herein and any other processing by implementing any functional means, modules, units, or circuitry. In one embodiment, for example, event detection system 600 comprises respective processing circuits or processing circuitry configured to perform the steps shown in FIG. 5. The circuits or circuitry in this regard may comprise circuits dedicated to performing certain functional processing and/or one or more microprocessors in conjunction with memory. For instance, the circuitry may include one or more microprocessor or microcontrollers, as well as other digital hardware, which may include digital signal processors (DSPs), special-purpose digital logic, and the like. The processing circuitry may be configured to execute program code stored in memory, which may include one or several types of memory such as read-only memory (ROM), random-access memory, cache memory, flash memory devices, optical storage devices, etc. Program code stored in memory may include program instructions for executing instructions for carrying out one or more of the techniques described herein, in several embodiments. In embodiments that employ memory, the memory stores program code that, when executed by the one or more processors, carries out the techniques described herein.

Thus, in some embodiments, a event detection circuitry 600 comprises processing circuitry 610 configured to determine a signal envelope for each of at least first and second power system signals, perform density-based spatial clustering of a series of points formed by combining respective values of the signal envelopes for at least the first and second power system signals, and detect one or more power system events by identifying outlier points or groups of points in the spatial clustering. The first and second power system signals might be, for example, one of the following pairs of power signals: positive sequence voltage magnitude and frequency; positive sequence voltage magnitude and positive sequence current magnitude; positive sequence voltage magnitude and rate of change of frequency (ROCOF); positive sequence current magnitude and frequency; and positive sequence current magnitude and ROCOF.

In some embodiments, processing circuitry 610 may be further configured to automatically classify the one or more power system events by: collecting a data set based on the detected power system events, the data set comprising, for each of the detected power system events, a plurality of power system signal features corresponding to the detected power system event; and classifying each of the detected power system events using the data set and a random forest classifier algorithm, wherein said classifying comprises determining a classification label from among two or more predetermined classification labels. In some of these embodiments, the plurality of power system signal features may include one or more features selected from the following: average voltage envelope area; maximum voltage envelope area; maximum frequency envelope area; average rate-of-change-of-frequency (ROCOF) envelope area; maximum ROCOF envelope area; frequency slope value; frequency drop value; oscillation frequency; oscillation amplitude; oscillation damping ratio; derivative of voltage; second derivative of voltage; number of PMUs that detected the power system event; and duration of event.

In some embodiments in which the processing circuitry 610 performs classification, the two or more predetermined classification labels may include at least one label selected from the following: severe fault; moderate fault; frequency drop; and other. In some embodiments, the processing circuitry may be further configured to: using power system signal features corresponding to detected power system events having a first classification, perform principal components analysis (PCA) to reduce the dimensionality of the features, to obtain two-dimensional data corresponding to the detected power system events having the first classification; and perform agglomerative hierarchical clustering of the two-dimensional data, to identify two or more groupings of events within the detected power system events having the first classification.

Those skilled in the art will also appreciate that embodiments herein further include corresponding computer programs.

An example computer program comprises instructions which, when executed on at least one processor of an event detection system 600, cause the event detection system 600 to carry out any of the respective processing described above. A computer program in this regard may comprise one or more code modules corresponding to the means or units described above.

Embodiments further include a carrier containing such a computer program. This carrier may comprise one of an electronic signal, optical signal, radio signal, or computer readable storage medium.

In this regard, embodiments herein also include a computer program product stored on a non-transitory computer readable (storage or recording) medium and comprising instructions that, when executed by a processor of the event detection system 600, cause the fault protection system 600 to perform as described above.

Embodiments further include a computer program product comprising program code portions for performing the steps of any of the embodiments herein when the computer program product is executed by a computing device. This computer program product may be stored on a computer readable recording medium.

Notably, modifications and other embodiments of the disclosed invention(s) will come to mind to one skilled in the art having the benefit of the teachings presented in the foregoing descriptions and the associated drawings. Therefore, it is to be understood that the invention(s) is/are not to be limited to the specific embodiments disclosed and that modifications and other embodiments are intended to be included within the scope of this disclosure. Although specific terms may be employed herein, they are used in a generic and descriptive sense only and not for purposes of limitation.

What is claimed is:

1. A method for detecting power system events in an electrical power system, the method comprising:
    determining a signal envelope for each of at least first and second power system signals;
    performing density-based spatial clustering of a series of points formed by combining respective values of the signal envelopes for at least the first and second power system signals; and
    detecting one or more power system events by identifying outlier points or groups of points in the spatial clustering.

2. The method of claim 1, wherein the first and second power system signals are one of the following pairs of power signals:
    positive sequence voltage magnitude and frequency;
    positive sequence voltage magnitude and positive sequence current magnitude;
    positive sequence voltage magnitude and rate of change of frequency (ROCOF);
    positive sequence current magnitude and frequency; and
    positive sequence current magnitude and ROCOF.

3. The method of claim 1, further comprising automatically classifying the one or more power system events by:
    collecting a data set based on the detected power system events, the data set comprising, for each of the detected power system events, a plurality of power system signal features corresponding to the detected power system event; and
    classifying each of the detected power system events using the data set and a machine-learning-based classification algorithm, wherein said classifying comprises determining a classification label from among two or more predetermined classification labels.

4. The method of claim 3, wherein the machine-learning-based classification algorithm is a random forest classifier algorithm.

5. The method of claim 3, wherein the plurality of power system signal features includes one or more features selected from the following:

average voltage envelope area;

maximum voltage envelope area;

maximum frequency envelope area;

average rate-of-change-of-frequency (ROCOF) envelope area;

maximum ROCOF envelope area;

frequency slope value;

frequency drop value;

oscillation frequency;

oscillation amplitude;

oscillation damping ratio;

derivative of voltage;

second derivative of voltage;

number of phasor measurement units (PMUs) that detected the power system event; and duration of event.

6. The method of claim 3, wherein the two or more predetermined classification labels include at least one label selected from the following:

severe fault;

moderate fault;

frequency drop; and other.

7. The method of claim 3, further comprising:

using power system signal features corresponding to detected power system events having a first classification, performing principal components analysis (PCA) to reduce the dimensionality of the features, to obtain two-dimensional data corresponding to the detected power system events having the first classification; and performing agglomerative hierarchical clustering of the two-dimensional data, to identify two or more groupings of events within the detected power system events having the first classification.

8. A event detection system for detecting power system events in an electrical power system, the event detection system comprising:

processing circuitry configured to:

determine a signal envelope for each of at least first and second power system signals;

perform density-based spatial clustering of a series of points formed by combining respective values of the signal envelopes for at least the first and second power system signals; and detect one or more power system events by identifying outlier points or groups of points in the spatial clustering.

9. The event detection system of claim 8, wherein the first and second power system signals are one of the following pairs of power signals:

positive sequence voltage magnitude and frequency;

positive sequence voltage magnitude and positive sequence current magnitude;

positive sequence voltage magnitude and rate of change of frequency (ROCOF);

positive sequence current magnitude and frequency; and positive sequence current magnitude and ROCOF.

10. The event detection system of claim 8, wherein the processing circuitry is further configured to automatically classify the one or more power system events by:

collecting a data set based on the detected power system events, the data set comprising, for each of the detected power system events, a plurality of power system signal features corresponding to the detected power system event; and classifying each of the detected power system events using the data set and a machine-learning-based classification algorithm, wherein said classifying comprises determining a classification label from among two or more predetermined classification labels.

11. The event detection system of claim 10, wherein the machine-learning-based classification algorithm is a random forest classifier algorithm.

12. The event detection system of claim 10, wherein the plurality of power system signal features includes one or more features selected from the following:

average voltage envelope area;

maximum voltage envelope area;

maximum frequency envelope area;

average rate-of-change-of-frequency (ROCOF) envelope area;

maximum ROCOF envelope area;

frequency slope value;

frequency drop value;

oscillation frequency;

oscillation amplitude;

oscillation damping ratio;

derivative of voltage;

second derivative of voltage;

number of phasor measurement units (PMUs) that detected the power system event; and duration of event.

13. The event detection system of claim 10, wherein the two or more predetermined classification labels include at least one label selected from the following:

severe fault;

moderate fault;

frequency drop; and other.

14. The event detection system of claim 10, wherein the processing circuitry is further configured to:

using power system signal features corresponding to detected power system events having a first classification, perform principal components analysis (PCA) to reduce the dimensionality of the features, to obtain two-dimensional data corresponding to the detected power system events having the first classification; and perform agglomerative hierarchical clustering of the two-dimensional data, to identify two or more groupings of events within the detected power system events having the first classification.

* * * * *